(12) United States Patent
Wolk et al.

(10) Patent No.: US 7,275,972 B2
(45) Date of Patent: Oct. 2, 2007

(54) METHOD OF MAKING AN ELECTROLUMINESCENT DEVICE HAVING A PATTERNED EMITTER LAYER AND NON-PATTERNED EMITTER LAYER

(75) Inventors: Martin B. Wolk, Woodbury, MN (US); Leslie A. Kreilich, Saint Paul, MN (US); Sergey A. Lamansky, Apple Valley, MN (US); John P. Baetzold, North Saint Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 406 days.

(21) Appl. No.: 10/646,093

(22) Filed: Aug. 22, 2003

(65) Prior Publication Data
US 2005/0040758 A1      Feb. 24, 2005

(51) Int. Cl.
*H01J 9/00*     (2006.01)
(52) U.S. Cl. .......................................... 445/24; 427/66
(58) Field of Classification Search ............ 455/23–25; 427/592, 66; 156/234
See application file for complete search history.

(56) References Cited

U.S. PATENT DOCUMENTS

| | | | |
|---|---|---|---|
| 5,707,745 A | 1/1998 | Forrest et al. | |
| 5,756,689 A | 5/1998 | Busman et al. | |
| 5,935,758 A | 8/1999 | Patel et al. | |
| 6,114,088 A | 9/2000 | Wolk et al. | |
| 6,194,119 B1 | 2/2001 | Wolk et al. | |
| 6,270,944 B1 | 8/2001 | Wolk et al. | |
| 6,291,116 B1 | 9/2001 | Wolk et al. | |
| 6,291,126 B2 | 9/2001 | Wolk et al. | |
| 6,358,664 B1 | 3/2002 | Nirmal et al. | |
| 6,384,528 B1 | 5/2002 | Friend et al. | |
| 6,410,201 B2 | 6/2002 | Wolk et al. | |
| 2001/0000744 A1 | 5/2001 | Wolk et al. | |
| 2001/0001050 A1 | 5/2001 | Miyashita et al. | |
| 2002/0041926 A1 | 4/2002 | Miyashita et al. | |
| 2002/0136823 A1 | 9/2002 | Miyashita et al. | |
| 2002/0155215 A1 | 10/2002 | Miyashita et al. | |
| 2003/0064248 A1 | 4/2003 | Wolk et al. | |
| 2003/0124265 A1 | 7/2003 | Bellmann et al. | |

FOREIGN PATENT DOCUMENTS

| | | |
|---|---|---|
| EP | 0 799 713 A | 10/1997 |
| EP | 0 799 713 A1 | 10/1997 |

(Continued)

OTHER PUBLICATIONS

Lee et al., *A New Patterning Method for Full-Color Polymer Light-Emitting Devices: Laser Induced Thermal Imaging (LITI)*, 2002 SID International Symposium Digest of Technical Papers, Boston, MA, May 21-23, 2002, SID International Symposium Digest of Technical Papers, San Jose, CA: SID, US, vol. 33/2, May 2002, pp. 784-787.

(Continued)

*Primary Examiner*—Joseph Williams
(74) *Attorney, Agent, or Firm*—Lance L. Vietzke

(57) ABSTRACT

Electroluminescent devices, and methods of making and using such devices, are disclosed. The electroluminescent devices include a patterned layer on a solvent-susceptible layer. The electroluminescent devices may be used, for example, as full color display devices.

25 Claims, 2 Drawing Sheets

FOREIGN PATENT DOCUMENTS

| | | |
|---|---|---|
| EP | 0 880 303 A1 | 11/1998 |
| EP | 0 920 385 A | 6/1999 |
| EP | 1 211 916 A1 | 6/2002 |
| WO | WO98/07575 | 2/1998 |
| WO | WO 00/41894 | 7/2000 |

OTHER PUBLICATIONS

Suh, M.C., et al., *Enhanced Luminance of Blue Light-Emitting Polymers by Blending with Hole-Transporting Materials*, ADV. Mater., vol. 15, No. 15, pp. 1254-1258 (Aug. 15, 2003).

Bharathan et al., "Polymer Electroluminescent Devices Processed By Inkjet Printing: I. Polymer Light-Emitting Logo", *Applied Physics Letters*, vol. 72, No. 21, pp. 2660-2662 (May 25, 1998).

Kobayashi et al., "A Novel RGB Multicolor Light-Emitting Polymer Display", *Synthetic Metals*, vol. 111-112, pp. 125-128 (2000), no month.

Lamansky et al., "Highly Phosphorescent Bis-Cyclometalated Iridium Complexes: Synthesis, Photophysical Characterization, and Use in Organic Light Emitting Diodes", *J. Am. Chem. Soc.*, vol. 123, pp. 4304-4312 (2001), no month.

Noda et al., "Organic Light-Emitting Diodes Using a Novel Family of Amorphous Molecular Materials Containing and Oligothiophene Moiety as Colour-Tunable Emitting Materials", *J. Mater. Chem.*, vol. 9, pp. 2177-2181 (1999), no month.

Tak et al., "Novel Patterning Method Using Nd:YAG and Nd:YVO$_4$ Lasers for Organic Light Emitting Diodes", *Synthetic Metals*, vol. 138, pp. 497-500 (2003), no month.

Seong Take Lee et al., "A New Patterning Method for Full-Color Polymer Ligh-Emitting Devides: Laser Induced Termal Imaging (LITI)" 2002 SID International Symposium Digest of Technical Papers, San Jose, CA: SID, US, vol. 33/2, (May 2002), pp. 784-787, XP001134318 *the whole document*.

METHOD OF MAKING AN ELECTROLUMINESCENT DEVICE HAVING A PATTERNED EMITTER LAYER AND NON-PATTERNED EMITTER LAYER

BACKGROUND

The formation of patterned light emitting layers is an important but difficult step in the production of electroluminescent devices. For example, the formation of separate red, green and blue patterned emitter layers is typically required in the production of electroluminescent full color display devices. Vacuum evaporation (e.g., using a shadow mask) is the most common technique to form each of the patterned layers. Because of the complexity and cost of this technique, particularly for use in making large format displays, other methods of forming patterned layers are needed in the art. Methods based on depositing materials from solution are especially desirable for their expected compatibility with large scale device fabrication.

Ink jet printing techniques have been suggested for producing patterned emitter layers. Depositing two colors of patterned emitter precursors by ink jet printing, followed by depositing a third color of emitter by solution techniques has been reported. However, the use of ink jet printing techniques to deposit patterned layers is limited by factors including solubility, wetting, and uniformity of the materials being deposited in the ink jet media.

SUMMARY OF THE INVENTION

In one aspect, the present invention provides a method of making an electroluminescent device. In one embodiment, the method includes: selectively thermally transferring a portion of a transfer layer including a first emitter to a receptor, which is optionally solvent-susceptible, to form a patterned emitter layer including the first emitter disposed on the receptor; and disposing a layer including a second emitter on the patterned emitter layer and the receptor to form a non-patterned emitter layer including the second emitter. Optionally, the method further includes selectively thermally transferring, prior to forming the non-patterned emitter layer, a portion of a second transfer layer including a third emitter to the receptor to form a second patterned emitter layer including the third emitter, disposed on the receptor. Preferably, the receptor is an anode, a hole transport layer, a hole injection layer, an electron blocking layer, a dielectric layer, a passivation layer, a substrate, or a combination thereof. Preferably, the non-patterned emitter layer is an undoped electron transport layer, a doped electron transport layer, an undoped hole blocking layer, a doped hole blocking layer, or a combination thereof. In some embodiments, the receptor is a hole transport layer and is attached to an anode, in which case the device can optionally include a hole injection layer disposed between the hole transport layer and the anode. Optionally, the method further includes disposing a cathode on the non-patterned emitter layer.

In another embodiment, the method of making an electroluminescent device includes: providing a non-patterned layer including a first emitter; and selectively thermally transferring a portion of a transfer layer including a second emitter to the non-patterned emitter layer, which is optionally solvent-susceptible, to form a patterned emitter layer including the second emitter, disposed on the non-patterned emitter layer. Optionally, the method further includes selectively thermally transferring a portion of a second transfer layer including a third emitter to the non-patterned emitter layer to form a second patterned emitter layer including the third emitter, disposed on the non-patterned emitter layer. Preferably, the non-patterned emitter layer is an undoped electron transport layer, a doped electron transport layer, an undoped hole blocking layer, a doped hole blocking layer, an undoped electron injecting layer, a doped electron injecting layer, or a combination thereof. In some embodiments, the method further includes disposing an anode on the patterned emitter layer and the non-patterned emitter layer. A hole transport layer, a hole injection layer, an electron blocking layer, or a combination thereof, can optionally be disposed between the emitter layers and the anode. Optionally, the side of the non-patterned emitter layer opposite the patterned emitter layer is attached to a cathode.

In another embodiment, the method of making an electroluminescent device includes: providing a solvent-susceptible layer; disposing a patterned layer including a first emitter and a non-volatile component that is the same as or different than the first emitter on the solvent-susceptible layer; and disposing a layer including a second emitter on the patterned layer and the solvent-susceptible layer to form a non-patterned emitter layer including the second emitter. Preferably, disposing the patterned layer includes selectively thermally transferring a portion of a transfer layer including the first emitter and the non-volatile component. Optionally, prior to forming the non-patterned emitter layer, a second patterned layer including a third emitter is disposed on the solvent-susceptible layer, preferably by thermally transferring a portion of a second transfer layer including the third emitter and, optionally, a non-volatile component.

In another embodiment, the method of making an electroluminescent device includes: providing a solvent-susceptible, non-patterned layer including a first emitter; and disposing a patterned layer including a second emitter and a non-volatile component that is the same as or different than the second emitter on the solvent-susceptible layer. Preferably, disposing the patterned layer includes selectively thermally transferring a portion of a transfer layer including the second emitter and the non-volatile component. Optionally, the method further includes disposing a second patterned layer including a third emitter and, optionally, a non-volatile component, on the solvent-susceptible layer, preferably by thermally transferring a portion of a second transfer layer including the third emitter.

In another aspect, the present invention provides an electroluminescent device. The electroluminescent device includes: a solvent-susceptible layer; a patterned layer on the solvent-susceptible layer, wherein the patterned layer includes a first emitter and a non-volatile component that is the same as or different than the first emitter; and a non-patterned layer including a second emitter disposed on the patterned emitter layer and the solvent susceptible layer. Optionally, the patterned layer further includes a third emitter. Alternatively, a second patterned layer may optionally be disposed on the solvent-susceptible layer, wherein the second patterned layer includes a third emitter. Preferably, the solvent-susceptible layer is a hole transport layer, a hole injection layer, an electron blocking layer, a dielectric layer, a passivation layer, or a combination thereof. Preferably, the non-patterned emitter layer is an undoped electron transport layer, a doped electron transport layer, an undoped hole blocking layer, a doped hole blocking layer, an undoped electron injecting layer, a doped electron injecting layer, or a combination thereof. In some embodiments, an anode can be attached to the solvent-susceptible layer and a cathode can be attached to the non-patterned emitter layer. Optionally, a hole injection layer, an electron blocking layer, or a combination thereof can be disposed between the anode and the solvent-susceptible layer. In one embodiment, the cathode is opaque, the anode is transparent, and the device is operable to emit light through the transparent anode. In another embodiment, the cathode is transparent, the anode is opaque, and the device is operable to emit light through the transparent cathode. In still another embodiment, the cathode is transparent, the device further includes an opaque substrate attached to the anode, and the device is operable to emit light through the transparent cathode. In yet another embodiment, the cathode is transparent, the anode is transparent, and the device is operable to emit light through the transparent cathode and the transparent anode. Optionally, the non-patterned emitter layer is solvent-susceptible.

In another aspect, the present invention provides a method of generating light. The method includes: providing an electroluminescent device as described herein; and providing a signal to the anode and the cathode, wherein the signal is operable to address an emitter, following which the emitter emits light. Preferably, the device is an active or passive addressed device. Preferably, the device is a full color display or tunable lighting device.

The emission characteristics of a multilayered OLED device can be altered by controlling or confining the zone in which the recombination of electrons and holes occurs. For a device with a single layer capable of efficient fluorescent or phosphorescent emission, the optimum device performance occurs when the recombination zone is located within the emitter layer. For a device with multiple emission layers (e.g. a red patterned emitter layer and a blue non-patterned emitter layer), it is possible to obtain emission predominantly from a single layer (e.g. the red patterned emitter layer). Therefore, it is possible to construct a full-color OLED display by, for example, patterning a substrate with red and green emitting regions and then providing a non-patterned blue emitter layer. If the recombination zone is controlled properly, the red and green emitting regions will not exhibit a significant blue emission. For display device applications, it is preferably to have display subpixels that emit saturated red, green, and blue colors. Therefore, in embodiments of the present invention in which patterned emitter layers are formed by selectively thermally transferring portions of emitter layers, it is possible to prepare an "n" color device (e.g., a three color device) by using fewer than "n" thermal transfer steps (e.g., two selective thermal transfer steps).

In some embodiments, it is possible, and sometimes preferable to alter the amount of emission from different layers of a multilayer device by varying the operating voltage or current density. This so-called "color tuning" can be useful for OLEDs used in lighting applications.

Definitions

As used herein, a "layer" refers to a discontinuous (e.g., a patterned layer) or continuous (e.g., non-patterned) material disposed on another material.

As used herein, a "patterned layer" refers to a discontinuous layer in which the material of the patterned layer is disposed on only selected portions of the other material.

As used herein, a "non-patterned layer" refers to a continuous layer in which the material of the non-patterned layer is disposed on an entire portion of the other material.

As used herein, a "solvent-susceptible" layer is a layer that would be dissolved, attacked, penetrated, and/or rendered inoperable for its intended purpose in the presence of a solvent, had a solvent-coated layer been coated directly on the solvent-susceptible layer.

As used herein, a "solvent" for a solvent-coated layer refers to an organic or an aqueous solvent that is capable of dissolving, dispersing, or suspending an organic polymer or resin that is suitable to form a layer of an electroluminescent device.

In general, a layer "disposed on" or "attached to" another layer is intended to be broadly interpreted to optionally include one or more additional layers between the two layers.

As used herein, a layer "on" or "disposed on" a "solvent-susceptible layer" is intended to include either a layer that is directly in contact with the solvent-susceptible layer, or a layer that is separated by one or more additional layers from the solvent-susceptible layer, with the proviso that solvent from the layer "on" or "disposed on" the solvent-susceptible layer would be capable of coming in contact with the solvent-susceptible layer (e.g., through vaporization, diffusion, or other methods of transporting the solvent through the additional layers). Preferably, a layer "on" or "disposed on" a "solvent-susceptible layer" is in direct contact with the solvent-susceptible layer.

As used herein, "transparent electrode" means a conductive element that substantially transmits visible light. An element that substantially transmits visible light preferably transmits at least 50%, and more preferably at least 80%, of incident visible light, particularly at the wavelengths corresponding to the device emission maxima, impinged normal to the surface of the element.

As used herein, "opaque electrode" means a conductive element that substantially absorbs or reflects visible light. An element that substantially absorbs or reflects visible light preferably absorbs or reflects at least 90% of incident visible light, particularly at the wavelengths corresponding to the device emission maxima, impinged normal to the surface of the element.

As used herein, an "active addressed" device is a device that includes a scheme for driving an array of pixels or subpixels, wherein each pixel or subpixel is addressed by a discrete circuit. Generally, the discrete circuit is adjacent to the pixel or subpixel and internal to the device.

As used herein, a "passive addressed" device is a device that includes a scheme for driving an array of pixels or subpixels, wherein each pixel or subpixel is addressed through electronic circuitry that includes row and column electrodes. Generally, the electronic circuitry is external to the device.

As used herein, "tunable lighting" device is an element that emits light of a variable color dependent upon the driving conditions (e.g. voltage, current density, etc.).

As used herein, "full color display" device means an electronic component comprising an array of pixels and subpixels that is capable of displaying an image with a color gamut suitable for portraying color photographs and videos (e.g. the gamut defined by the National Television Standards Committee NTSC).

As used herein, "non-volatile component" means a component with a negligible vapor pressure under the conditions typically used for vacuum evaporation or vacuum sublimation. Typically, a material that cannot be deposited at a rate of at least 0.1 Angstroms/second at a temperature below its decomposition temperature, is considered to be non-volatile.

DETAILED DESCRIPTION OF PREFERRED EMBODIMENTS

Figure 1A:
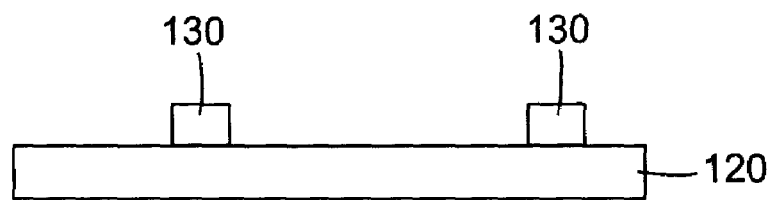
FIGS. 1A to 1C are schematic cross-sectional views illustrating an exemplary method of assembling electroluminescent devices according to the invention and having a "bottom anode" configuration. The methods illustrated in FIGS. 1A to 1C are illustrated in a simplified manner to exemplify preferred embodiments of the present invention. The inclusion of an additional layer or layers that would be desirable in the construction of specific devices would be obvious to one of skill in the art. Thus, the methods and devices illustrated herein are not intended to be limited solely to the specific layers described herein, but should be broadly interpreted as including additional layers as desired.

The present invention provides electroluminescent devices, and methods of making and using such devices. Electroluminescent devices are well known in the art and include, for example, organic electroluminescent (OEL) devices. See, for example, Salbeck, *Ber. Bunsenges. Phys. Chem.*, 100(10): 1667 (1996); Y. Sato, "Organic LED System Considerations" in *Semiconductors and Semimetals* (G. Meuller, ed.), Vol. 64, p. 209 (2000); Kido, *Bulletin of Electrochemistry*, 10(1):1 (1994); F. So et al., *International Journal of High Speed Electronics and Systems*, 8(2):247 (1997); Baldo et al., *Pure Appl. Chem.*, 71(11):2095 (1999). As used herein, "electroluminescent device" is meant to encompass complete and partial devices (e.g., device components). Similarly, methods of making electroluminescent devices are meant to encompass the formation or partial formation of devices or device components.

A layer or layers of an electroluminescent device may be formed via thermal transfer of a layer or layers from a thermal transfer donor element. As a particular example, a thermal transfer element can be formed for making, at least in part, an OEL device or array of devices, and components for use in OEL displays. This can be accomplished, for example, by thermal transfer of a single or a multicomponent transfer unit of a thermal transfer element. It will be recognized that single layer and multilayer transfers can be used to form other devices and objects. While the present invention is not so limited, an appreciation of various aspects of the invention will be gained through a discussion of the examples provided below.

Materials can be patterned onto substrates by selective thermal transfer of the materials from one or more thermal transfer elements. A thermal transfer element can be heated by application of directed heat on a selected portion of the thermal transfer element. Heat can be generated using a heating element (e.g., a resistive heating element), converting radiation (e.g., a beam of light) to heat, and/or applying an electrical current to a layer of the thermal transfer element to generate heat. In many instances, thermal transfer using light from, for example, a lamp or laser, is advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal transfer element, and the materials of the thermal transfer element.

A thermal transfer element can include a transfer layer that can be used to form various elements and devices, or portions thereof. Exemplary materials and transfer layers include those that can be used to form elements, devices, and portions thereof that are useful in electronic displays. While the examples used in the present invention most often focus on OEL devices and displays, transfer of materials from thermal transfer elements can also be used to form, at least in part, electronic circuitry and optical and electronics components such as resistors, capacitors, diodes, rectifiers, electroluminescent lamps, memory elements, field effect transistors, bipolar transistors, unijunction transistors, MOS transistors, metal-insulator-semiconductor transistors, organic transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or a combination thereof; for example, the combination of field effect transistors and organic electroluminescent lamps as an active matrix array for an optical display. Other items may be formed by transferring a multicomponent transfer unit and/or a single layer.

Thermal transfer using light can often provide better accuracy and quality control for very small devices, such as small optical and electronic devices, including, for example, transistors and other components of integrated circuits, as well as components for use in a display, such as electroluminescent lamps and control circuitry. Moreover, thermal transfer using light may, at least in some instances, provide for better registration when forming multiple devices over an area that is large compared to the device size. As an example, components of a display, which has many pixels, can be formed using this method.

In some instances, multiple thermal transfer elements may be used to form a device or other object, or to form adjacent devices, other objects, or portions thereof. The multiple thermal transfer elements may include thermal transfer elements with multicomponent transfer units and thermal transfer elements that transfer a single layer. For example, a device or other object may be formed using one or more thermal transfer elements with multicomponent transfer units and/or one or more thermal transfer elements that each can be used to transfer a single layer or a multilayer unit.

Thermal transfer of one or more layers to form a device or an array of devices can also be useful, for example, to reduce or eliminate wet processing steps of processes such as photolithographic patterning or ink-jet patterning, which are used to form many electronic and optical devices. Thermal transfer to pattern layers from donor elements can also be useful to de-couple layer coating steps from patterning steps, for example where such coupling can limit the types of layered structures, or the types of adjacent structures, that can be patterned. In conventional patterning processes such as photolithography, ink-jet, screen printing, and various mask-based techniques, layers are typically coated directly onto the substrate on which patterning occurs. Patterning can take place simultaneously with coating (as for ink-jet, screen printing, and some mask-based processes) or subsequent to coating via etching or another removal technique. A difficulty with such conventional approaches is that solvents used to coat materials, and/or etching processes used to pattern materials, can damage, dissolve, penetrate, and/or render inoperable previously coated or patterned layers or materials.

In the present invention, materials can be coated onto thermal transfer donor elements to form the transfer layers of the donor elements. The transfer layer materials can then be patterned via selective thermal transfer from the donor to a receptor. Coating onto a donor followed by patterning via selective transfer represents a de-coupling of layer coating steps from patterning steps. An advantage of de-coupling coating and patterning steps is that materials can be patterned on top of or next to other materials that would be difficult to pattern, if possible at all, using conventional patterning processes. For example, in methods of the present invention a solvent-coated layer can be patterned on a solvent-susceptible material that would be dissolved, attacked, penetrated, and/or rendered inoperable for its intended purpose in the presence of the solvent had the solvent-coated layer been coated directly on the solvent-susceptible material. The same holds for patterned thermal transfer of solvent-coated materials next to, but not necessarily in contact with, materials or layers on a receptor that may be incompatible with the solvent.

A "solvent-susceptible" layer is a layer that would be dissolved, attacked, penetrated, and/or rendered inoperable for its intended purpose in the presence of a solvent, had a solvent-coated layer been coated directly on the solvent-susceptible layer. A simple test for solvent susceptibility is performed by spin coating a first layer from a first solvent, drying the solvent, and then spin coating a second solvent on top of the first coated layer. If the first coated layer is dissolved, attacked, or penetrated by the second solvent, then the first coated layer is considered to be a solvent-susceptible layer. Alternatively, a similar test can be performed when the first coated layer has been deposited by vacuum evaporation.

The "second solvent" is preferably an organic solvent that is capable of dissolving, dispersing, or suspending an organic polymer or resin that is suitable to form a layer of an electroluminescent device. Suitable solvents can be found, for example, in I. M. Smallwood, "Handbook of Organic Solvent Properties", Arnold/Halsted Press (1996).

In some embodiments of the present invention, the transfer layer will include a non-volatile component. A non-volatile component is a chemical compound with a negligible vapor pressure under conditions typically used for vacuum evaporation or vacuum sublimation. A simple test for determining whether a compound is non-volatile is to attempt to sublime the compound under vacuum deposition conditions for that component. Non-volatile compounds generally decompose (e.g. char, degrade, etc.) or fail to sublime at a rate sufficient to be practical for vacuum deposition in currently available vacuum deposition systems. Typically, materials which cannot achieve a deposition rate of at least 0.1 Angstroms/second at a temperature below their decomposition temperature, can be considered to be non-volatile. Common examples of non-volatile components include polymers, oligomers, dendrimers, large molecular weight species, ceramics, etc.

As will be discussed in more detail below, the formation of OEL devices provides particularly suited examples. Exemplary donor elements, thermal transfer methods, and devices made by thermal transfer methods are disclosed, for example, in U.S. Pat. No. 6,410,201 (Wolk et al.).

For thermal transfer using radiation (e.g., light), a variety of radiation-emitting sources can be used in the present invention. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geqq 100$ milliwatts (mW)) single mode laser diodes, fiber-coupled laser diodes, and diode-pumped solid state lasers (e.g., Nd:YAG and Nd:YLF). Laser exposure dwell times can be in the range from, for example, 0.1 to 100 microseconds and laser fluences can be in the range of, for example, 0.01 to 1 joules per centimeter squared ($J/cm^2$).

When high spot placement accuracy is required (e.g. for high information full color display applications) over large substrate areas, a laser is particularly useful as the radiation source. Laser sources are compatible with both large rigid substrates such as 1 m×1 m×1.1 mm glass, and continuous or sheeted film substrates, such as 100 micrometer polyimide sheets.

Resistive thermal print heads or arrays may be used, for example, with simplified donor film constructions that may lack a light to heat conversion (LTHC) layer or a radiation absorber. This may be particularly useful with smaller substrate sizes (e.g., less than approximately 30 cm in any dimension) or for larger patterns, such as those required for alphanumeric segmented displays.

During imaging, the thermal transfer element is typically brought into intimate contact with a receptor. In at least some instances, pressure or vacuum are used to hold the thermal transfer element in intimate contact with the receptor. A radiation source is then used to heat the LTHC layer (and/or other layer(s) containing radiation absorber) in an imagewise fashion (e.g., digitally or by analog exposure through a mask) to perform imagewise transfer of the transfer layer from the thermal transfer element to the receptor according to a pattern.

Alternatively, a heating element, such as a resistive heating element, may be used to transfer the transfer unit. The thermal transfer element is selectively contacted with the heating element to cause thermal transfer of a portion of the transfer layer according to a pattern. In another embodiment, the thermal transfer element may include a layer that can convert an electrical current applied to the layer into heat.

Typically, the transfer layer is transferred to the receptor without transferring any of the other layers of the thermal transfer element, such as the optional interlayer and the LTHC layer. The presence of the optional interlayer may eliminate or reduce the transfer of the LTHC layer to the receptor and/or reduce distortion in the transferred portion of the transfer layer. Preferably, under imaging conditions the adhesion of the interlayer to the LTHC layer is greater than the adhesion of the interlayer to the transfer layer. In some instances, a reflective or an absorptive interlayer can be used to attenuate the level of imaging radiation transmitted through the interlayer and reduce any damage to the transferred portion of the transfer layer that may result from interaction of the transmitted radiation with the transfer layer and/or the receptor. This is particularly beneficial in reducing thermal damage which may occur when the receptor is highly absorptive of the imaging radiation.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element moved beneath the laser.

Thermal transfer donor substrates can be polymer films. One suitable type of polymer film is a polyester film, for example, polyethylene terephthalate or polyethylene naphthalate films. However, other films with sufficient optical properties (if light is used for heating and transfer), including high transmission of light at a particular wavelength, as well as sufficient mechanical and thermal stability for the particular application, can be used. The donor substrate, in at least some instances, is flat so that uniform coatings can be formed thereon. The donor substrate is also typically selected from materials that remain stable despite heating of the LTHC layer. The typical thickness of the donor substrate ranges from 0.025 to 0.15 mm, preferably 0.05 to 0.1 mm, although thicker or thinner donor substrates may be used.

Typically, the materials used to form the donor substrate and the LTHC layer are selected to improve adhesion between the LTHC layer and the donor substrate. An optional priming layer can be used to increase uniformity during the coating of subsequent layers and also increase the interlayer bonding strength between the LTHC layer and the donor substrate. One example of a suitable substrate with primer layer is available from Teijin Ltd. (Product No. HPE100, Osaka, Japan).

An optional interlayer may be disposed between the LTHC layer and transfer layer in thermal transfer elements to minimize damage and contamination of the transferred portion of the transfer layer and may also reduce distortion in the transferred portion of the transfer layer. The interlayer may also influence the adhesion of the transfer layer to the rest of the thermal transfer element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

The interlayer may provide a number of benefits. The interlayer may be a barrier against the transfer of material to or from the light-to-heat conversion layer. It may also modulate the temperature attained in the transfer layer so that thermally unstable materials can be transferred. The presence of an interlayer may also result in improved plastic memory in the transferred material.

Thermal transfer elements can include an optional release layer. The optional release layer typically facilitates release of the transfer layer from the rest of the thermal transfer element (e.g., the interlayer and/or the LTHC layer) upon heating of the thermal transfer element, for example, by a light-emitting source or a heating element. In at least some cases, the release layer provides some adhesion of the transfer layer to the rest of the thermal transfer element prior to exposure to heat.

The release layer may be part of the transfer layer or a separate layer. All or a portion of the release layer may be transferred with the transfer layer. Alternatively, most or substantially all of the release layer can remain with the donor substrate when the transfer layer is transferred. In some instances, for example with a release layer that includes a sublimable material, a portion of the release layer may be dissipated during the transfer process.

The transfer layers of thermal transfer elements of the present invention can include one or more layers for transfer to a receptor. These one or more layers may be formed using organic, inorganic, organometallic, and other materials.

Although the transfer layer is described and illustrated as having one or more discrete layers, it will be appreciated that, at least in some instances where more than one layer is used, there may be an interfacial region that includes at least a portion of each layer. This may occur, for example, if there is mixing of the layers or diffusion of material between the layers before, during, or after transfer of the transfer layer. In other instances, individual layers may be completely or partially mixed before, during, or after transfer of the transfer layer. In any case, these structures will be referred to as including more than one independent layer, particularly if different functions of the device are performed by the different regions.

The transfer layer may include an adhesive layer disposed on an outer surface of the transfer layer to facilitate adhesion to the receptor. The adhesive layer may be an operational layer, for example, if the adhesive layer conducts charges between the receptor and the other layers of the transfer layer, or a non-operational layer, for example, if the adhesive layer only adheres the transfer layer to the receptor. The adhesive layer may be formed using, for example, thermoplastic polymers, including conducting and non-conducting polymers, conducting and non-conducting filled polymers, and/or conducting and non-conducting dispersions.

The transfer layer may also include a release layer disposed on the surface of the transfer layer that is in contact with the rest of the thermal transfer element. As described above, this release layer may partially or completely transfer with the remainder of the transfer layer, or substantially all of the release layer may remain with the thermal transfer element, or the release layer may dissipate in whole or in part, upon transfer of the transfer layer. Suitable release layers are described above.

Although the transfer layer may be formed with discrete layers, it will be understood that, in at least some embodiments, the transfer layer may include layers that have multiple components and/or multiple uses in the device. It will also be understood that, at least in some embodiments, two or more discrete layers may be melted together during transfer or otherwise mixed or combined. In any case, these layers, although mixed or combined, will be referred to as individual layers.

The transfer of a one or more single or multicomponent transfer units to form at least a portion of an OEL (organic electroluminescent) device provides a particularly illustrative, non-limiting example of the formation of an active device using a thermal transfer element. In at least some instances, an OEL device includes a thin layer, or layers, of one or more suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, for example, Tsutsui, *MRS Bulletin,* 22:39-45 (1997)).

Illustrative examples of OEL device constructions include molecularly dispersed polymer devices where charge carrying and/or emitting species are dispersed in a polymer matrix (see, for example, Kido, *Trends in Polymer Science,* 2:350-355 (1994)), conjugated polymer devices where layers of polymers such as polyphenylene vinylene act as the charge carrying and emitting species (see, for example, Halls et al., *Thin Solid Films,* 276:13-20 (1996)), vapor deposited small molecule heterostructure devices (see, for example, U.S. Pat. No. 5,061,569 (VanSlyke et al.) and Chen et al., *Macromolecular Symposia,* 125:1-48 (1997)), light emitting electrochemical cells (see, for example, Pei et al., *J. Amer. Chem. Soc.,* 118:3922-3929 (1996)), and vertically stacked organic light-emitting diodes capable of emitting light of multiple wavelengths (see, for example, U.S. Pat. No. 5,707,745 (Forrest et al.) and Shen et al., *Science,* 276:2009-2011 (1997)).

As used herein, the term "small molecule" refers to a non-polymeric organic, inorganic, or organometallic molecule, and the term "organic small molecule" refers to a non-polymer organic or organometallic molecule. In OEL devices, small molecule materials can be used as emitter layers, as charge transport layers, as dopants in emitter layers (e.g., to control the emitted color) or charge transport layers, and the like.

For many applications, such as display applications, it is preferred that at least one of the cathode and anode be transparent to the light emitted by the electroluminescent device. This depends on the orientation of the device (i.e, whether the anode or the cathode is closer to the substrate) as well as the direction of light emission (i.e., through the substrate or away from the substrate).

The anode and cathode are typically formed using conducting materials such as metals, alloys, metallic compounds, metal oxides, conductive ceramics, conductive dispersions, and conductive polymers, including, for example, gold, platinum, palladium, aluminum, titanium, titanium nitride, indium tin oxide (ITO), fluorine tin oxide (FTO), and polyaniline. The anode and the cathode can be single layers of conducting materials or they can include multiple layers. For example, an anode or a cathode may include a layer of aluminum and a layer of gold, a layer of aluminum and a layer of lithium fluoride, or a metal layer and a conductive organic layer. It may be particularly useful to provide a two-layer cathode (or anode) consisting of a conductive organic layer (e.g., 0.1 to 5 micrometers thick) and a thin metal or metal compound layer (e.g., 100 to 1000 Angstroms). Such a bilayer electrode construction may be more resistant to moisture or oxygen that can damage underlying moisture- or oxygen-sensitive layers in a device (e.g., organic light emitting layers). Such damage can occur when there are pinholes in the thin metal layer, which can be covered and sealed by the conductive organic layer. Damage and/or device failure can be caused by cracking or fracturing of the thin metal layer. Addition of a conductive organic layer can make the metal layer more resistant to fracture, or can act as a diffusion barrier against corrosive substances and as a conductive bridge when fracturing occurs.

The hole transport layer facilitates the injection of holes into the device and their migration towards the cathode. The hole transport layer can further act as a barrier for the passage of electrons to the anode. The hole transport layer can include, for example, a diamine derivative, such as N,N'-bis(3-methylphenyl)-N,N'-diphenylbenzidine (also known as TPD) or other hole conductive materials such as N,N'-bis(3-naphthalen-2-yl)-N,N'-bis(phenyl)benzidine (NBP). In general, the hole transport layer can include organic small molecule materials, conductive polymers, a polymer matrix doped with an organic small molecule, and other suitable organic or inorganic conductive or semiconductive materials.

The electron transport layer facilitates the injection of electrons and their migration towards the anode. The electron transport layer can further act as a barrier for the passage of holes to the cathode.

The emitter layer is often formed from a metal chelate compound, such as, for example, tris(8-hydroxyquinoline) aluminum (ALQ). Emitter layers can also include light emitting polymers such as poly(phenylenevinylene)s (PPVs), poly-para-phenylenes (PPPs), and polyfluorenes (PFs); organic small molecule materials, of which ALQ is an example; polymers doped with organic small molecules; and other suitable materials.

Optionally, the electron transport layer can be doped with a fluorescent or phosporescent dye as described herein. Doped electron transport layers are sometimes referred to herein as electron transport/emitter layers. In preferred embodiments, the electron transport layer is doped with a blue fluorescent dye.

For embodiments that include an electron transport/emitter layer, the interface between the hole transport layer and electron transport/emitter layer forms a barrier for the passage of holes and electrons and thereby creates a hole/electron recombination zone and provides an efficient organic electroluminescent device. When the emitter material is ALQ, the OEL device emits blue-green light. The emission of light of different colors may be achieved by the use of different emitters and dopants in the electron transport/emitter layer (see, for example, Chen et al., *Macromolecular Symposia,* 125:1-48 (1997)).

For embodiments that include an electron transport/emitter layer and a second emitter layer, the electron transport/emitter layer can be prepared to function solely as an electron transport layer so that recombination and emission is confined to the second emitter layer. Preferably, this construction is capable of providing an efficient organic electroluminescent device.

Other OEL multilayer device constructions may include, for example, a hole transport layer that is also an emitter layer. Alternatively, the hole transport layer and the electron transport/emitter layer could be combined into one layer. Furthermore, a separate emitter layer could be interposed between a hole transport layer and an electron transport layer.

Patterning OEL materials and layers to form OEL devices provides a particularly suited example to illustrate some difficulties with conventional patterning techniques and how these difficulties can be overcome according to the present invention. With conventional patterning techniques, there may be some materials or layers that cannot be used due to susceptibility to attack, penetration, or dissolution from exposure to solvents or etchants used to coat or pattern other layers on the display substrate. Thus, there may be device and/or display constructions that cannot be made by conventional techniques because a solvent-coated layer would be coated on a solvent-susceptible layer, or because an etchant would be used to pattern layers on other layers that are susceptible to the etchant. For example, in forming an OEL device that includes an anode on a substrate, a small molecule hole transport layer on the anode, a light emitting polymer emitter on the hole transport layer, and a cathode on the emitter layer, the solvent used to coat the light emitting polymer may damage the hole transport layer under conventional processing techniques. The same limitations may hold for conventional patterning of adjacent OEL devices, one of which may contain a light emitting polymer emitter layer and the other of which may contain an organic small molecule emitter layer. These limitations can be overcome using thermal patterning methods of the present invention. Overcoming these limitations allows a wider range of possible device constructions and materials alternatives, and these in turn may be used to achieve OEL devices and displays that exhibit characteristics such as brightness, lifetime, color purity, efficiency, etc., that might not otherwise be achieved. Thus, the present invention provides new OEL device and display constructions as well as new patterning methods.

As discussed, OEL devices can be formed by selective thermal transfer from one or more donor elements. Multiple devices can also be transferred onto a receptor to form a pixilated display. Alternatively, the red, green, and blue thermal transfer elements could be transferred on top of one another to create a multi-color stacked OLED device of the type disclosed in U.S. Pat. No. 5,707,745 (Forrest et al.).

Still another method for forming multi-color pixilated OEL displays is to pattern red, green, and blue emitters (for example) from three separate donors, and then, in a separate step, to pattern all the cathodes (and, optionally, electron transport layers) from a single donor element. In this way, each OEL device is patterned by at least two thermal transfers, the first of which patterns the emitter portion (and, optionally, an adhesive layer, a buffer layer, anode, hole injection layer, hole transport layer, electron blocking layer, and the like), and the second of which patterns the cathode portion (and, optionally, an electron injecting layer, electron transport layer, hole blocking layer, and the like).

One advantage of splitting the device layers between two or more donor elements (e.g., an emitter donor and a cathode donor) is that the same donor elements can be used to pattern the emitter portion of OEL devices for either passive matrix or active matrix display constructions. Generally, active matrix displays include a common cathode that is deposited over all the devices. For this construction, thermal transfer of an emitter stack that includes a cathode may not be necessary, and having a cathode-less transfer stack may be desirable. For passive matrix displays, cathode-less donors can be used to transfer each of the emitter portions (a different donor for each color, if multi-color is desired), followed by patterning of the cathodes for each device from the same, separate donor element. Alternately, the cathode of a passive matrix display can be patterned using the method described by Y.-H Tak et al., *Synthetic Metals*, 138:497 (2003), in which a common cathode is applied to the substrate and subsequently separated by a laser ablation process. Thus, various emitter donors can be used for various display constructions.

Another advantage of the present invention is that OEL devices, for example, can be transferred and patterned according to the described methods to form adjacent devices having different, and otherwise incompatible, types of emitter materials. For example, red-emitting organic small molecule devices (e.g., that use an active vapor-deposited small molecule layer) can be patterned on the same receptor as blue-emitting light emitting polymer devices (e.g., that use an active solution-coated light emitting polymer layer). This allows flexibility to choose light-emitting materials (and other device layer materials) based on functionality (e.g., brightness, efficiency, lifetime, conductivity, physical properties after patterning (e.g., flexibility, etc.)) rather than on compatibility with the particular coating and/or patterning techniques used for the other materials in the same or adjacent devices. The ability to choose different types of emitter materials for different color devices in an OEL display can offer greater flexibility in choosing complementary device characteristics. The ability to use different types of emitters can also become important when the preferred emitter material for one OEL device is incompatible with the preferred emitter material for another OEL device.

The substrate may be any item suitable for a particular application including, but not limited to, transparent films, display black matrices, passive and active portions of electronic displays (e.g., electrodes, thin film transistors, organic transistors, etc.), metals, semiconductors, glass, various papers, and plastics. Non-limiting examples of substrates which can be used in the present invention include anodized aluminum and other metals, plastic films (e.g., polyethylene terephthalate, polypropylene), indium tin oxide coated plastic films, glass, indium tin oxide coated glass, flexible circuitry, circuit boards, silicon or other semiconductors, and a variety of different types of paper (e.g., filled or unfilled, calendered, or coated). For OEL displays, the type of substrate used often depends on whether the display is a top emitting display (emitter layer or layers positioned between the viewer and the substrate), a bottom emitting display (substrate positioned between the viewer and the emitter layer or layers), or both a top and bottom emitting display. For a top emission display, the substrate need not be transparent. For a bottom emission display, a transparent substrate is typically desired.

When a substrate is used as a receptor (e.g., as a receptor for a thermally transferred layer), various layers (e.g., an adhesive layer) may be coated onto the substrate to facilitate transfer of the transfer layer to the receptor. Other layers may be coated on the substrate to form a portion of a multilayer device. For example, an OEL or other electronic device may be formed using a substrate having a metal and/or conductive organic anode or cathode formed on the substrate prior to transfer of the transfer layer from the thermal transfer element. The anode or cathode may be formed, for example, by depositng one or more conductive layers on the substrate and patterning of the layer(s) into one or more anodes or cathodes using any suitable method, for example, photolithographic techniques or the thermal transfer techniques taught herein.

A particularly useful substrate for patterning multilayer devices is one that has a common electrode or a pattern of electrodes along with a pattern of insulating barriers on top of at least a portion of the electrode(s). The insulating barriers can be provided in a pattern that corresponds to the intended position of the edges of the multilayer devices to help prevent electrical shorts between the receptor electrode(s) and the opposing electrode transferred along with or on top of a multilayer stack. This is especially useful in passive matrix displays. Also, in active matrix display constructions, the insulating barriers can help isolate the transistors of the active matrix from the common electrode, which is generally provided. This can help prevent leakage currents and parasitic capacitance which can reduce device efficiencies.

Electroluminescent (EL) devices emit light toward a viewer position and may to be characterized as "bottom anode" or "top anode." The terms "bottom anode" and "top anode" indicate the relative positions of the anode, the substrate, and the cathode. In a "bottom anode" device, the anode is positioned between the substrate and the cathode. In a "top anode" device, the cathode is positioned between the anode and the substrate. In some embodiments described herein, the substrate may be a receptor or part of a receptor (e.g., a receptor for thermally transferred materials).

Bottom anode and top anode devices may be further characterized as "bottom emitting" or "top emitting." The terms "bottom emitting" and "top emitting" indicate the relative positions of the substrate, the emitter layer or layers, and the viewer. The viewer position generally indicates the intended destination for the emitted light whether the "viewer" is a human observer, a screen, an optical component, an electronic device, or the like. In bottom emitting EL devices, a transparent or semitransparent substrate is positioned between the emitter layer or layers and the viewer. In the inverted, or top emitting, configuration, the emitter layer or layers are positioned between the substrate and the viewer.

In general, device constructions disclosed herein are illustrated in a simplified manner to exemplify preferred embodiments of the present invention. The inclusion of an additional layer or layers that would be desirable in the construction of specific devices would be obvious to one of skill in the art. Thus, the device constructions illustrated herein are not intended to be limited solely to the specific layers described herein, but should be broadly interpreted as including additional layers as desired.

Figure 1B:
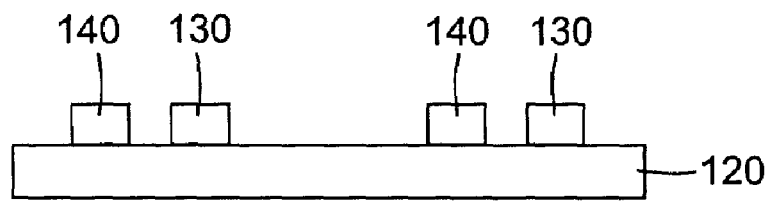
Figure 1C:
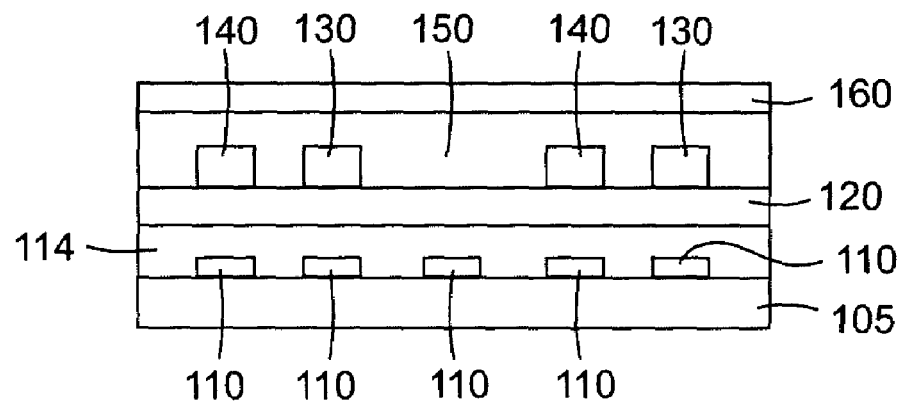

Turning now to the drawings, FIGS. 1A to 1C illustrate the assembly of an electroluminescent device according to the invention, and in particular a "bottom anode" configuration.

One or more patterned emitter layers 130 including a first emitter (e.g., red, green, or blue light emitting) are disposed on receptor 120, which may be an anode or a layer attached to an anode. In some embodiments, patterned emitter layers 130 include a non-volatile component, which may be the same as or different than the first emitter. In some embodiments, patterned emitter layers 130 are disposed on receptor 120 by selectively thermally transferring a portion of a transfer layer including a first emitter to receptor 120 to form patterned emitter layers 130.

Optionally, referring to FIG. 1B, one or more additional patterned emitter layers 140 including additional emitters may be disposed on receptor 120. In some embodiments, patterned emitter layers 140 may include non-volatile components, which may be the same as or different than the additional emitters. In some embodiments, additional patterned emitter layers 140 are disposed on receptor 120 by selectively thermally transferring portions of one or more additional transfer layers including additional emitters. Preferably, the additional emitters emit different colors of light than the first emitter.

Referring to FIG. 1C, a layer including a second emitter is then disposed on the patterned emitter layers to form non-patterned emitter layer 150 (e.g., red, green or blue light emitting). Preferably, the second emitter layer 150 emits a different color of light than the first emitter layer 130 and any additional emitter layers 140.

In some embodiments, receptor 120 is solvent-susceptible. Receptor 120 may also be, for example, a hole transport layer, a hole injection layer, an electron blocking layer, a dielectric layer, a passivation layer, or a combination thereof. Receptor 120 may be attached, for example, to anode 110, which is preferably patterned. Additional layers may be disposed between receptor 120 and anode 110. For example, if receptor 120 is a hole transport layer, hole injection layer 114 may be disposed between receptor 120 and anode 110. Further, anode 110 may be attached to substrate 105.

Non-patterned emitter layer 150 may further be, for example, an electron transport layer that may optionally be doped (e.g., with a fluorescent or phosphorescent dye), a hole blocking layer that may optionally be doped (e.g., with a fluorescent or phosphorescent dye), or a combination thereof. Cathode 160 may be disposed on non-patterned emitter layer 150.

For embodiments wherein the electroluminescent device is a bottom emitting device, anode 110 and substrate 105 are transparent, and cathode 160 is preferably opaque.

For embodiments wherein the electroluminescent device is a top emitting device, cathode 160 is transparent, and anode 110 and/or substrate 105 are preferably opaque.

A configuration in which substrate 105, anode 110, and cathode 160 are all transparent is considered to be both top and bottom emitting.

Figure 2A:
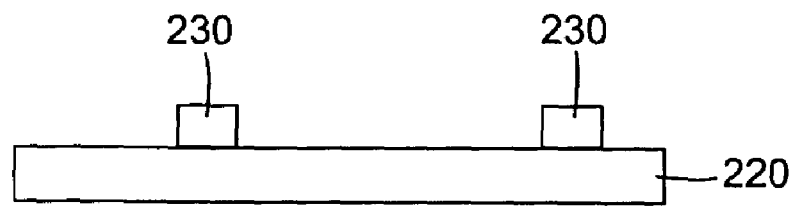
FIGS. 2A to 2C are schematic cross-sectional views illustrating an exemplary method of assembling electroluminescent devices according to the invention and having a "top anode" configuration. The methods illustrated in FIGS. 2A to 2C are illustrated in a simplified manner to exemplify preferred embodiments of the present invention. The inclusion of an additional layer or layers that would be desirable in the construction of specific devices would be obvious to one of skill in the art. Thus, the methods and devices illustrated herein are not intended to be limited solely to the specific layers described herein, but should be broadly interpreted as including additional layers as desired.
Figure 2B:
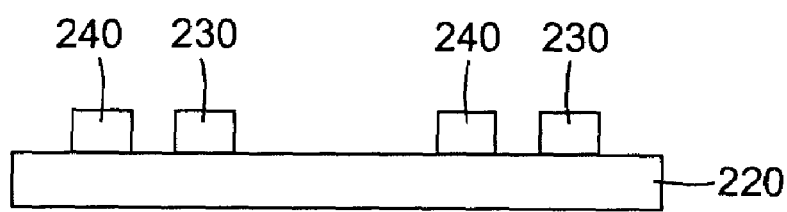
Figure 2C:
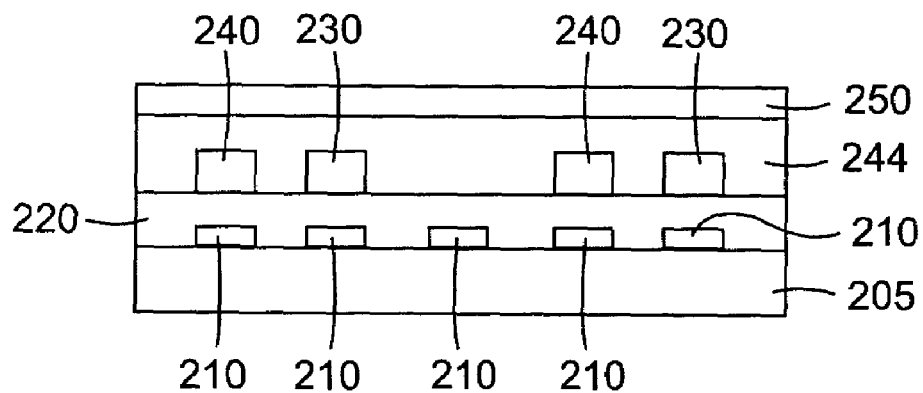

FIGS. 2A to 2C illustrate the assembly of an electroluminescent device according to the invention and in particular a "top anode" configuration.

A non-patterned layer 220 including a first emitter (e.g., red, green, or blue light emitting) is provided. One or more patterned emitter layers 230 including a second emitter are disposed on non-patterned emitter layer 220. In some embodiments, patterned emitter layers 230 include a non-volatile component, which may be the same or different than the second emitter. In some embodiments, patterned emitter layers 230 are disposed on non-patterned emitter layer 220 by selectively thermally transferring a portion of a transfer layer including a second emitter to non-patterned emitter layer 220 to form patterned emitter layers 230.

Optionally, referring to FIG. 2B, one or more additional patterned emitter layers 240 including additional emitters may be disposed on non-patterned emitter layer 220. In some embodiments, patterned emitter layers 240 may include non-volatile components, which may be the same as or different than the additional emitters. In some embodiments, additional patterned emitter layers 240 are disposed on non-patterned emitter layer 220 by selectively thermally transferring portions of one or more additional transfer layers including additional emitters. Preferably, the additional emitters emit different colors of light than the first and second emitters.

Optionally, referring to FIG. 2C, anode 250 may be disposed on patterned emitter layers 230 and, if present, additional patterned emitter layers 240. Additional layers may be disposed between anode 250 and patterned emitter layers 230 and, if present, patterned emitter layers 240. For example, hole transport layer, hole injection layer, or electron blocking layer 244 may be disposed between anode 250 and patterned emitter layers 230 and, if present emitter layers, 240.

In some embodiments, non-patterned emitter layer 220 is solvent-susceptible. Non-patterned emitter layer may further be, for example, an electron transport layer that may optionally be doped (e.g., with a fluorescent or phosphorescent dye), a hole blocking layer that may optionally be doped (e.g., with a fluorescent or phosphorescent dye), an electron injecting layer that may optionally be doped (e.g., with a fluorescent or phosphorescent dye), or a combination thereof. Non-patterned emitter layer 220 may be attached, for example, to cathode 210, which is preferably patterned. Further, cathode 210 may be attached, for example, to substrate 205.

For embodiments wherein the electroluminescent device is a bottom emitting device, cathode 210 is transparent, substrate 205, if present, is transparent, and anode 250 is preferably opaque.

For embodiments wherein the electroluminescent device is a top emitting device, anode 250 is transparent, and cathode 210 and/or substrate 205 are preferably opaque.

A configuration in which substrate 205, anode 250, and cathode 210 are all transparent, is considered to be both top and bottom emitting.

The devices schematically illustrated in FIGS. 1A to 1C and 2A to 2C are preferably operable to emit light by providing a signal to the anode and the cathode. Preferably the signal is operable to address an emitter, following which the emitter emits light. In general, arrays of pixels or sub-pixels may be addressed using active or passive addressing schemes as defined herein above. Both full color display devices and tunable lighting devices are possible within the scope of the invention. A full color display device generally employs three emitters, each emitting light of a different color such as red, green and blue light. A tunable lighting device generally uses two emitters, each emitting light of a different color. The device may be operated by providing current to each of the subpixels within a pixel. A change in the ratio of currents to the subpixels will affect both the color and the brightness of the light emitted from the pixel.

EXAMPLES

The present invention is illustrated by and will be more fully appreciated with reference to the following non-limiting examples. The particular examples, materials, amounts and procedures are to be interpreted broadly in accordance with the scope and spirit of the invention as set forth herein.

Unless otherwise specified, all parts are parts by weight, and all ratios and percentages are by weight. For simplicity, various abbreviations are used in the examples and have the meaning given and/or describe materials that are commercially available as noted in the following table.

| Abbreviation | Description/Commercial Source |
|---|---|
| PEDOT | A mixture of water and 3,4-polyethylenedioxythiophene-polystyrenesulfonate(cationic) available from H. C. Starck, Newton, MA as PEDOT VP AI 4083 |
| EL111T | A material for forming a layer of an electroluminescent device available from Hodogaya Chemical Co., Ltd., Kawasaki, Japan as EL111T |
| 2-mTNATA | 4,4',4''-tris(N-(2-naphthyl)-N-(3-methylphenyl)-amino)-triphenylamine available from Bando Chemical Industries, Kobe, Japan as 2-MTNATA |
| ST 1693.S | 2,7-bis-(N-phenyl-N-(4'-N,N-diphenylamino-biphenyl-4-yl))-9,9-dimethyl-fluorene, sublimed, available from Syntec GmbH, Wolfen, Germany as ST 1693.S |
| ST 755.S | 1,1-bis-(4-bis(4-methyl-phenyl)-amino-phenyl)-cyclohexane, sublimed, available from Syntec GmbH, Wolfen, Germany as ST 755.S |
| LEP | Covion Super Yellow, PDY 132, a yellow emitter available from Covion Semiconductors, Frankfurt, Germany |
| PS | Polystyrene standard, typical $M_w$ = 2500, available as product number 32,771-9 from Aldrich Chemical Company, Milwaukee, WI |
| PVK | Poly-N-vinyl carbazole, available as product number P2236-VK from Polymer Source Inc., Dorval, Canada |
| MTDATA | 4,4',4''-tris(N-3-methylphenyl-N-phenylamino)triphenylamine, sublimed, available from H. W. Sands Corp., Jupiter, FL as product number OSA3939 |
| PBD | 2-(4-biphenylyl)-5-(4-tertbutylphenyl)-1,3,4-oxadiazole), available from Dojindo Laboratories, Kumamoto, Japan |
| EL028T | A material for forming a layer of an electroluminescent device available from Hodogaya Chemical Co., Ltd., Kawasaki, Japan as EL028T |
| TPOB | A material prepared according to the procedure described in Noda et al., J. Mater. Chem., 9: 2177-2181 (1999) |
| Spiro-$CF_3$-PBD | A material for forming a layer of an electroluminescent device available from Covion Semiconductors, Frankfurt, Germany as Spiro-$CF_3$-PBD |
| Ir(ppy)$_3$-S-C-1 | A green emitter available from Covion Semiconductors, Frankfurt, Germany |
| Ir(ppy)$_2$(tmhd) | A green emitter prepared according to the procedure described in Lamansky et al., J. Am. Chem. Soc., 123: 4304-4312 (2001) |
| Ir(btp)$_2$(tmhd) | A red emitter prepared according to the procedure described in Lamansky et al., J. Am. Chem. Soc., 123: 4304-4312 (2001) |
| BAlq | Bis-(2-methyl-8-quinolato)-4-(phenyl-phenolato)-aluminum-(III), sublimed, available from Eastman Kodak Company, Rochester, NY |
| Perylene blue dye | Available from Aldrich Chemical Company, Milwaukee, WI |
| LiF | Lithium fluoride, 99.85%, available as product number 36359 from Alfa Aesar, Ward Hill, MA |
| Aluminum | Puratronic aluminum shots, 99.999%, available from Alfa Aesar, Ward Hill, MA |
| FC Surfactant | A fluorochemical surfactant prepared according to Example 5 of U.S. Pat. No. 3,787,351 |
| Ebecryl 629 | An epoxynovolac acrylate available from UCB Radcure Inc., N. Augusta, SC as Ebecryl 629 |
| Elvacite 2669 | An acrylic resin available from ICI Acrylics Inc., Memphis, TN as Elvacite 2669 |

-continued

| Abbreviation | Description/Commercial Source |
| --- | --- |
| Irgacure 369 | 2-benzyl-2-(dimethylamino)-1-(4-(morpholinyl)phenyl) butanone, available from Ciba Specialty Chemicals Corporation, Tarrytown, NY as Irgacure 369 |
| Irgacure 184 | 1-hydroxycyclohexyl phenyl ketone, available from Ciba Specialty Chemicals Corporation, Tarrytown, NY as Irgacure 184 |
| M7Q film | A 0.076 mm thick polyethylene terephthalate film available from Teijin, Osaka, Japan as M7Q |
| UV | Ultraviolet |
| nm | Nanometer |
| m | Meter |
| min | Minute |
| SR 351HP | Trimethylolpropane triacrylate ester, available from Sartomer, Exton, PA as SR 351HP |
| LITI | Laser-induced thermal imaging |
| ITO | Indium tin oxide |
| Block pixel ITO glass | Glass substrate having a region of ITO measuring 50 mm × 50 mm × 0.7 mm and a resistance of <20 Ohm/sq, available from Delta Technologies, Stillwater, MN |
| Striped pixel ITO glass | Glass substrate having a region of ITO measuring 50 mm × 50 mm × 0.7 mm, said region comprising a pattern of adjacent, parallel 75 micrometers wide stripes of ITO with a pitch of 165 micrometers and a resistance of <20 Ohm/sq, available from Delta Technologies, Stillwater, MN |
| LTHC | Light-to-heat conversion |
| Raven 760 Ultra | Carbon black pigment, available from Columbian Chemical Co., Atlanta, GA as Raven 760 Ultra |
| Butvar B-98 | Polyvinyl butyrol resin, available from Solutia, Inc., St. Louis, MO as Butvar B-98 |
| Joncryl 67 | Acrylic resin available from S.C. Johnson & Sons, Racine, WI as Joncryl 67 |
| Disperbyk 161 | A dispersant available from Byk-Chemie, USA, Wallingford, CT as Disperbyk 161 |
| Wt. % | Weight percent |
| Puradisc filter | A 0.45 micrometer polypropylene filter available from Whatman Inc., Clifton, NJ under the tradename Puradisc |

Materials not identified in the foregoing table were obtained from Aldrich Chemical Company, Milwaukee, Wis., unless noted otherwise.

General Preparation of Donor Film

A donor film was used in each example and was prepared as described in this general preparation. A LTHC solution was prepared by mixing 3.55 parts Raven 760 Ultra, 0.63 parts Butvar B-98, 1.90 parts Joncryl 67, 0.32 parts Disperbyk 161, 0.09 parts FC Surfactant, 12.09 parts Ebecryl 629, 8.06 parts Elvacite 2669, 0.82 parts Irgacure 369, 0.12 parts Irgacure 184, 45.31 parts 2-butanone, and 27.19 parts 1,2-propanediol monomethyl ether acetate. This solution was coated onto M7Q film using a Yasui Seiki Lab Coater, Model CAG-150, with a microgravure roll having 110 helical cells per inch. The LTHC coating was in-line dried at 80° C. and cured under UV radiation supplied by a Fusion UV Systems Inc. 600 Watt D bulb at 100% energy output (UVA 320 to 390 nm) with an exposure speed of 6.1 m/min.

An interlayer solution was made by mixing 14.85 parts SR 351HP, 0.93 parts Butvar B-98, 2.78 parts Joncryl 67, 1.25 parts Irgacure 369, 0.19 parts Irgacure 184, 48 parts 2-butanone, and 32 parts 1-methoxy-2-propanol. This solution was coated onto the cured LTHC layer by a rotogravure method using a Yasui Seiki lab coater, Model CAG-150, with a microgravure roll having 180 helical cells per lineal inch. This coating was in-line dried at 60° C. and cured under UV radiation supplied by passing the coating under a Fusion UV Systems Inc. 600 Watt D bulb at 60% energy output (UVA 320 to 390 nm) at 6.1 m/min.

Example 1

Example 1 illustrates a method of making an electroluminescent device according to the invention in which a transfer layer comprising a first emitter is selectively thermally transferred to a receptor to form a patterned emitter layer, and a layer comprising a second emitter is disposed on the patterned emitter layer to provide a non-patterned emitter layer.

Preparation of Receptor

PEDOT was filtered twice using a Puradisc filter, and spin-coated onto a block pixel ITO glass substrate to yield a layer having a dry thickness of 40 nm. The coated glass substrate was baked for 5 minutes at 200° C. under a nitrogen atmosphere. Using methanol, the coated layer was selectively removed from portions of the ITO region to provide contact areas for connecting the receptor to a power supply.

Preparation of Donor

LEP (a yellow emitter) and PS were combined in a 1:3 weight ratio, diluted with HPLC grade toluene to 1.58 wt. %, heated and stirred at 70° C., filtered once using a Puradisc filter, and spin-coated onto a donor film prepared as described in the General Preparation to yield a transfer layer having a dry thickness of 90 nm.

Selective Thermal Transfer of Patterned Emitter Layer

The transfer layer from the donor was imaged onto the receptor by LITI to yield a patterned emitter layer. Two lasers were used at a power of 16 watts in a unidirectional scan with a triangle dither pattern and frequency of 400

KHz. The requested line width was 100 micrometers with a pitch of 225 micrometers, and the dose was 0.650 J/cm$^2$.

Deposition of Non-Patterned Emitter Layer

A 500 Å thick layer of BAlq doped with approximately 0.5-1% by weight perylene blue dye was deposited via a standard vacuum deposition technique onto the patterned emitter layer under a vacuum of approximately $10^{-5}$ torr and using a shadow mask that prevented the material from being deposited on the ITO contact area for connecting to a power supply.

Deposition of Cathode

A two layer cathode consisting of a 10 Å thick film of LiF followed by a 2000 Å thick film of aluminum were sequentially deposited on the non-patterned emitter layer. Deposition was carried out under a vacuum of approximately $10^{-6}$ torr and using a second shadow mask that allowed for contact between the cathode and the ITO contact area on the receptor.

Preparation of Control Device Corresponding to Example 1

A control device corresponding to the device of Example 1 was prepared to demonstrate that the yellow emission color from the patterned emitter layer was unaffected by the presence of the perylene blue dye in the non-patterned emitter layer.

The control device comprised a receptor like that employed in Example 1. LEP (a yellow emitter) and PS were combined in a 1:3 weight ratio, diluted with HPLC grade toluene to 1.58 wt. %, heated and stirred at 70° C., filtered once through a Puradisc filter, and immediately spin coated on to the receptor to a dry thickness of 90 nm. This provided a non-patterned emitter layer that corresponded in composition to the patterned emitter layer in Example 1. The coated layer was selectively removed from portions of the ITO region to provide contact areas for connecting the receptor to a power supply.

A layer containing perylene blue dye was prepared and deposited on the non-patterned emitter layer. More specifically, a 500 Å thick layer of BAlq doped with approximately 0.5-1% by weight perylene blue dye was deposited via a standard vacuum deposition technique onto the non-patterned emitter layer under a vacuum of approximately $10^{-5}$ torr. A shadow mask was used to prevent the material from being deposited on the ITO contact area for connecting to a power supply.

A cathode was deposited on the layer containing perylene blue dye by following the procedure used for the cathode in Example 1.

Electroluminescence Spectra

Electroluminescence spectra for Example 1 and its control device were obtained by driving the devices with a Keithley Source Meter 2400 (Keithley Instruments, Cleveland, Ohio) and recording the output at four different device current densities (10, 20, 30 and 40 mA/cm$^2$) with an Ocean Optics Fiber Optic Fluorescent Spectrometer (Ocean Optics Inc., Dunedin, Fla.).

Example 1 showed a pattern of yellow stripes contributed by the patterned emitter layer and, between the yellow stripes, blue stripes contributed by the non-patterned emitter layer. The control device, however, showed only a yellow area contributed by the non-patterned emitter layer and no blue area. Thus, in both devices, the layer containing perylene blue dye substantively provided only an electron-transport function where it was deposited on the layer containing the yellow emitter (i.e., the patterned emitter layer in Example 1, and the non-patterned emitter layer in the control device) with no observable shift of the exciton recombination zone to the layer containing the perylene blue dye. These devices also demonstrate the independence of spectral characteristics and CIE color coordinates of driving current.

Example 2

Example 2 illustrates a method of making an electroluminescent device according to the invention in which a transfer layer comprising a first emitter is selectively thermally transferred to a receptor to form a patterned emitter layer, and a layer comprising a second emitter is disposed on the patterned emitter layer to provide a non-patterned emitter layer.

Preparation of Receptor

A receptor was prepared following the procedure used in Example 1.

Preparation of Donor

PVK-4, MTDATA, PBD, and Ir(btp)$_2$(tmhd) (a red emitter) were combined in a 42:28:27:3 weight ratio and then diluted with HPLC grade toluene to 1.97% by weight. The resulting solution was filtered twice through a Puradisc filter and spin-coated onto a donor film prepared as described in the General Preparation to yield a transfer layer having a dry thickness of 55 nm.

Selective Thermal Transfer of Patterned Emitter Layer

The transfer layer from the donor was imaged onto the receptor by LITI to yield a patterned emitter layer. One laser was used at a power of 4 watts in a unidirectional scan with a triangle dither pattern and frequency of 400 KHz. The requested line width was 100 micrometers with a pitch of 225 micrometers and the dose was 0.875 J/cm$^2$.

Deposition of Non-Patterned Emitter Layer and Deposition of Cathode

A non-patterned emitter layer containing perylene blue dye and a two-layer cathode were then deposited on the patterned emitter layer following the procedure described in conjunction with Example 1 for the deposition of these layers.

Preparation of Control Device Corresponding to Example 2

A control device corresponding to the device of Example 2 was prepared to demonstrate that the red emission color from the patterned emitter layer was unaffected by the presence of the perylene blue dye in the non-patterned emitter layer.

The control device comprised a receptor like that employed in Example 2. PVK-4, MTDATA, PBD, and Ir(btp)$_2$(tmhd) (red emitter) were combined in a 42:28:27:3 weight ratio and then diluted with HPLC grade toluene to 1.97% by weight. The resulting solution was filtered twice through a Puradisc filter and spin-coated on to the receptor to a dry thickness of 50 nm to provide a non-patterned emitter layer that corresponded in composition to the patterned emitter layer in Example 2. The coated layer was selectively removed from portions of the ITO region to provide contact areas for connecting the receptor to a power supply.

A layer containing perylene blue dye was prepared and deposited on the non-patterned emitter layer. More specifically, a 500 Å thick layer of BAlq doped with approximately 0.5-1% by weight perylene blue dye was deposited via a standard vacuum deposition technique onto the non-patterned emitter layer under a vacuum of approximately $10^{-5}$ torr. A shadow mask was used to prevent the material from being deposited on the ITO contact area for connecting to a power supply.

A cathode was applied to the layer containing perylene blue dye by following the procedure used for the cathode in Example 2.

Electroluminescence Spectra

Electroluminescence spectra for Example 2 and its control device were observed by applying electrical power to the devices with an Agilent E3612 DC power supply (Agilent Technologies, Palo Alto, Calif.) and microscopically examining the electroluminescence with a Nikon Eclipse TE300 inverted optical microscope (Nikon Corporation, Tokyo, Japan).

Example 2 showed a pattern of red stripes contributed by the patterned emitter layer and, between the red stripes, blue stripes contributed by the non-patterned emitter layer. The control device, however, showed only a red area contributed by the non-patterned emitter layer and no blue area. Thus, in both devices, the layer containing perylene blue dye substantively provided only an electron-transport function where it was deposited on the layer containing the red emitter (i.e., the patterned emitter layer in Example 2, and the non-patterned emitter layer in the control device) with no observable shift of the exciton recombination zone to the layer containing the perylene blue dye.

Example 3

Example 3 illustrates a method of making an electroluminescent device according to the invention in which a transfer layer comprising a first emitter is selectively thermally transferred to a receptor to form a patterned emitter layer, and a layer comprising a second emitter is disposed on the patterned emitter layer to provide a non-patterned emitter layer. Example 3 was prepared by following the procedure of Example 2 except that the $Ir(btp)_2(tmhd)$ red emitter was replaced by $Ir(ppy)_2(tmhd)$, a green emitter.

Preparation of Control Device Corresponding to Example 3

A control device corresponding to the device of Example 3 was prepared to demonstrate that the green emission color from the patterned emitter layer was unaffected by the presence of the perylene blue dye in the non-patterned emitter layer. The control device for Example 3 was prepared by following the procedure used in conjunction with the control device for Example 2, except that the $Ir(btp)_2(tmhd)$ red emitter was replaced by $Ir(ppy)_2(tmhd)$, a green emitter.

Electroluminescence Spectra

Electroluminescence spectra for Example 3 and its control device were observed using the procedure described in conjunction with Example 2.

Example 3 showed a pattern of green stripes contributed by the patterned emitter layer and, between the green stripes, blue stripes contributed by the non-patterned emitter layer. The control device, however, showed only a green area contributed by the non-patterned emitter layer and no blue area. Thus, in both devices, the layer containing perylene blue dye substantively provided only an electron-transport function where it was deposited on the layer containing the green emitter (i.e., the patterned emitter layer in Example 3, and the non-patterned emitter layer in the control device) with no observable shift of the exciton recombination zone to the layer containing the perylene blue dye.

Example 4

Example 4 illustrates a method of making an electroluminescent device according to the invention in which transfer layers comprising a first emitter and a second emitter are selectively thermally transferred to a receptor to form a patterned emitter layer, and a layer comprising a third emitter is disposed on the patterned emitter layer to provide a non-patterned emitter layer. The first emitter was provided by the red emitter of Example 2, and the second emitter was provided by the green emitter of Example 3.

A receptor was prepared by following the procedure described in conjunction with Example 1 and separate donors, each containing a transfer layer, were prepared according to Example 2 (red emitter) and Example 3 (green emitter). The transfer layer containing the red emitter was imaged onto the receptor by LITI using the laser arrangement described in Example 2, except with a pitch of 300 micrometers. The transfer layer containing the green emitter was imaged onto the same receptor, also by LITI and again using the laser arrangement described in Example 2, except with a pitch of 300 micrometers. The origin for the transfer layer containing the green emitter was shifted +100 micrometers relative to the origin for the transfer layer containing the red emitter.

A non-patterned emitter layer containing perylene blue dye and a two-layer cathode were then deposited on the patterned emitter layer containing the first (red) and second (green) emitters using the procedure described in conjunction with Example 1 for the deposition of these layers.

Electroluminescence Spectra

The electroluminescence spectrum for Example 4 was observed using the procedure described in conjunction with Example 2 and showed a pattern of alternating red, green and blue stripes, the red and green emission patterns corresponding to the areas patterned by selective thermal transfer via LITI.

Example 5

Example 5 illustrates a method of making an electroluminescent device according to the invention in which transfer layers comprising a first emitter and a second emitter are selectively thermally transferred to a receptor to form a patterned emitter layer on a solvent-susceptible layer, and a layer comprising a third emitter is disposed on the patterned emitter layer to provide a non-patterned emitter layer.

Preparation of Receptor

A solution of EL111T was made at 5.0% by weight in HPLC grade toluene and allowed to stir for 20 minutes at 70° C. on a hotplate. The solution was then filtered through a Puradisc filter and spin-coated onto striped pixel ITO glass to yield a solvent-susceptible layer having a dry thickness of 160 nm. Using toluene, the coated layer was selectively removed from portions of the ITO region to provide contact areas for connecting the receptor to a power supply.

Preparation of Donor

To prepare a first donor corresponding to the first emitter, EL028T, Spiro-$CF_3$-PBD, and $Ir(btp)_2(tmhd)$, a red emitter, were combined in a 45:45:10 weight ratio, diluted with chlorobenzene to 1.35% by weight, and allowed to stir for 20 minutes at 70° C. on a hotplate. The resulting solution was filtered once through a Puradisc filter and spin-coated onto a donor film prepared as described in the General Preparation to yield a transfer layer having a dry thickness of 50 nm. A second donor corresponding to the second emitter was prepared in the same manner but substituting a green emitter, $Ir(ppy)_3$-S-C-1, for the red emitter.

Selective Thermal Transfer of Patterned Emitter Layers

The transfer layer from the first donor was imaged onto the receptor by LITI to yield a patterned emitter layer. One laser was used at a power of 4 watts in a unidirectional scan with a triangle dither pattern and frequency of 400 KHz. The requested line width was 110 micrometers with a pitch of 495 micrometers and the dose was 0.85 J/cm$^2$. The transfer layer from the second donor was then imaged onto the same receptor by LITI and using the same laser arrangement to provide a patterned emitter layer comprising first (red) and second (green) emitters. The origin for the transfer layer containing the green emitter was shifted +165 micrometers relative to the origin for the transfer layer containing the red emitter.

Deposition of Non-Patterned Emitter Layer and Deposition of Cathode

A non-patterned emitter layer containing perylene blue dye and a two-layer cathode were then deposited on the patterned emitter layer comprising the first (red) and second (green) emitters following the procedure described in conjunction with Example 1 for the deposition of these layers.

Electroluminescence Spectra

The electroluminescence spectrum for Example 5 was observed using the procedure described in conjunction with Example 2 and showed a pattern of alternating red, green and blue stripes, the red and green emission patterns corresponding to the areas patterned by the selective thermal transfer via LITI.

Example 6

Example 6 illustrates a method of making an electroluminescent device according to the invention in which a transfer layer comprising a first emitter is selectively thermally transferred to a receptor to form a patterned emitter layer on a solvent-susceptible layer, and a layer comprising a second emitter is disposed on the patterned emitter layer to provide a non-patterned emitter layer.

Preparation of Receptor

A solution of 2-mTNATA was made at 6.0% by weight in HPLC grade toluene, filtered once through a Puradisc filter, and spin-coated onto striped pixel ITO glass to yield a solvent-susceptible layer having a dry thickness of 162 nm. Using toluene, the coated layer was selectively removed from portions of the ITO region to provide contact areas for connecting the receptor to a power supply.

Preparation of Donor

TAPC, TPOB (sublimed), and Ir(ppy)$_2$(tmhd) (a green emitter) were combined in a 45:45:10 weight ratio, diluted with chlorobenzene to 1.78% by weight, and allowed to stir for 20 minutes at 70° C. on a hotplate. The resulting solution was filtered once through a Puradisc filter and spin-coated onto a donor film prepared as described in the General Preparation to yield a transfer layer having a dry thickness of 45 nm.

Selective Thermal Transfer of Patterned Emitter Layer

The transfer layer from the donor was imaged onto the receptor by LITI to yield a patterned emitter layer that was in registration with every other ITO stripe. One laser was used at a power of 4 watts in a unidirectional scan with a triangle dither pattern and frequency of 400 KHz. The requested line width was 110 micrometers with a pitch of 330 micrometers and the dose was 0.90 J/cm$^2$.

Deposition of Non-Patterned Emitter Layer and Deposition of Cathode

A non-patterned emitter layer containing perylene blue dye and a two-layer cathode were then deposited on the patterned emitter layer following the procedure described in conjunction with Example 1 for the deposition of these layers.

Preparation of Control Devices for Example 6

Two control devices were prepared for Example 6. The first control device was prepared following the procedure used to prepare Example 6 except that during the selective thermal transfer of the transfer layer, the pitch was 165 micrometers which resulted in a pattern that was in registration with every ITO stripe. The second control device was also prepared following the procedure used in conjunction with Example 6 except omitting preparation of the donor and thermal transfer of the transfer layer. Consequently, in the second control device, the non-patterned emitter layer containing perylene blue dye was disposed directly on the solvent-susceptible layer and without an intervening patterned emitter layer.

Electroluminescence Spectra

The electroluminescence spectra for the device of Example 6 and its two control devices were observed using the procedure described in conjunction with Example 2. The device of Example 6 showed a pattern of alternating green and blue stripes, the green emission pattern corresponding to the area patterned by the selective thermal transfer via LITI. The first control device showed a pattern of green stripes corresponding to the area patterned by the selective thermal transfer via LITI, and the second control device showed a pattern of blue stripes corresponding to the pattern of ITO stripes.

Example 7

Example 7 illustrates a method of making an electroluminescent device according to the invention in which a transfer layer comprising a first emitter is selectively thermally transferred to a receptor to form a patterned emitter layer on a solvent-susceptible layer, and a layer comprising a second emitter is disposed on the patterned emitter layer to provide a non-patterned emitter layer.

Example 7 was prepared by following the procedure described in conjunction with Example 6 except that in the solvent-susceptible layer deposited on the receptor, 2-mTNATA was replaced by ST 1693.S and this layer was applied so as to have a dry thickness of 140 nm. Two control devices for Example 7 were also prepared following the procedure described in conjunction with Example 6 except for the presence, on the receptor, of the solvent-susceptible layer containing ST 1693.S instead of 2-mTNATA.

Electroluminescence Spectra

The electroluminescence spectra for the device of Example 7 and its two control devices were observed using the procedure described in conjunction with Example 6. The device of Example 7 showed a pattern of alternating green and blue stripes, the green emission pattern corresponding to the area patterned by the selective thermal transfer via LITI. The first control device showed a pattern of green stripes corresponding to the area patterned by the selective thermal transfer via LITI, and the second control device showed a pattern of blue stripes corresponding to the pattern of ITO stripes.

Example 8

Example 8 illustrates a method of making an electroluminescent device according to the invention in which a transfer layer comprising a first emitter is selectively thermally transferred to a receptor to form a patterned emitter layer on a solvent-susceptible layer, and a layer comprising a second emitter is disposed on the patterned emitter layer to provide a non-patterned emitter layer.

Preparation of Receptor

A solution of ST 755.S was made at 5.0 wt. % in chlorobenzene, allowed to stir for 20 minutes at 70° C. on a hotplate, filtered once through a Puradisc filter, and spin-coated onto striped pixel ITO glass. The coated ITO glass was baked for 10 minutes at 80° C. under a nitrogen atmosphere to yield a solvent-susceptible layer having a dry thickness of 126 nm. Using toluene, the coated layer was selectively removed from portions of the ITO region to provide contact areas for connecting the receptor to a power supply.

Preparation of Donor

ST 755.S, TPOB (sublimed), and Ir(btp)$_2$(tmhd) (a red emitter) were combined in a 44.26:44.26:11.5 weight ratio, diluted with chlorobenzene to 1.71% by weight, and allowed to stir for 20 minutes at 70° C. on a hotplate. The resulting solution was filtered once through a Puradisc filter and spin-coated onto a donor film prepared as described in the General Preparation to yield a transfer layer having a dry thickness of 45 nm, after being baked at 80° C. for 10 minutes under a nitrogen atmosphere.

Preparation of Control Devices for Example 8

Two control devices were prepared for Example 8. The first control device was prepared by imaging the transfer layer from the donor to the receptor using one laser at a power of 4 watts in a unidirectional scan with a triangle dither pattern and frequency of 400 KHz. The requested line width was 110 micrometers with a pitch of 165 micrometers and a dose of 0.90 J/cm$^2$, resulting in an imaged pattern that was in registration with every ITO stripe. A non-patterned emitter layer containing perylene blue dye and a two-layer cathode were then deposited on the patterned emitter following the procedure described in conjunction with Example 1 for the deposition of these layers.

The second control device was also prepared following the procedure used in conjunction with Example 8 except omitting preparation of the donor and thermal transfer of the transfer layer. Consequently, in the second control device, the non-patterned emitter layer containing perylene blue dye was disposed directly on the solvent-susceptible layer and without an intervening patterned emitter layer.

Electroluminescence Spectra

The electroluminescence spectra for the device of Example 8 and its two control devices were observed using the procedure described in conjunction with Example 2. The first control device showed a pattern of red stripes corresponding to the area patterned by the selective thermal transfer via LITI, and the second control device showed a pattern of blue stripes corresponding to the pattern of ITO stripes.

Example 9

Example 9 illustrates a method of making an electroluminescent device according to the invention in which a transfer layer comprising a first emitter is selectively thermally transferred to a receptor to form a patterned emitter layer on a solvent-susceptible layer, and a layer comprising a second emitter is disposed on the patterned emitter layer to provide a non-patterned emitter layer.

Example 9 was prepared by following the procedure described in conjunction with Example 8, except that in the solvent-susceptible layer that was deposited on the substrate, ST 755.S was replaced ST 1693.S and this layer was applied so as to have a dry thickness of 140 nm. In addition, the solution of ST 1693.S was made at 6.0% by weight in toluene and allowed to stir for 5 minutes under ambient conditions before being filtered and spin-coated. Two control devices for Example 9 were also prepared following the procedure described in conjunction with Example 8 except for the presence of the of ST 1693.S in the solvent-susceptible layer that was deposited on the receptor instead of ST 755.S.

Electroluminescence Spectra

The electroluminescence spectra for the two control devices were observed using the procedure described in conjunction with Example 6. The first control device showed a pattern of red stripes corresponding to the area patterned by the selective thermal transfer via LITI, and the second control device showed a pattern of blue stripes corresponding to the pattern of ITO stripes.

Example 10

Example 10 illustrates a method of making an electroluminescent device according to the invention in which transfer layers comprising a first emitter and a second emitter are selectively thermally transferred to a receptor to form a patterned emitter layer on a solvent-susceptible layer, and a layer comprising a third emitter is disposed on the patterned emitter layer to provide a non-patterned emitter layer.

Preparation of Receptor

A solution of ST 755.S was made at 5.0 wt. % in chlorobenzene, allowed to stir for 20 minutes at 70° C. on a hotplate, filtered through a Puradisc filter, and spin-coated onto striped pixel ITO glass. The coated ITO glass was baked for 10 minutes at 80° C. under a nitrogen atmosphere to yield a solvent-susceptible layer having a dry thickness of 126 nm. Using toluene, the coated layer was selectively removed from portions of the ITO region to provide contact areas for connecting the receptor to a power supply.

Preparation of Donor

To prepare a first donor corresponding to the first emitter, ST 755.S, TPOB, and Ir(btp)$_2$(tmhd) (a red emitter) were combined in a 44.26:44.26:11.5 weight ratio, diluted with chlorobenzene to 1.71% by weight, and stirred for 20 minutes at 70° C. on a hotplate. The resulting solution was filtered once through a Puradisc filter and spin-coated onto a donor film prepared as described in the General Preparation to yield a transfer layer having a dry thickness of 45 nm, after baking in an oven at 80° C. for 10 minutes under a nitrogen atmosphere. A second donor corresponding to the second emitter was prepared in the same manner but substituting a green emitter, Ir(ppy)$_2$ (tmhd), for the red emitter.

Selective Thermal Transfer of Patterned Emitter Layers

The transfer layer from the first donor was imaged onto the receptor by LITI to yield a patterned emitter layer. One laser was used at a power of 4 watts in a unidirectional scan with a triangle dither pattern and frequency of 400 KHz. The requested line width was 110 micrometers with a pitch of 495 micrometers and the dose was 0.90 J/cm$^2$. The transfer layer from the second donor was then imaged onto the same receptor by LITI and using the same laser arrangement to provide a patterned emitter layer comprising first (red) and second (green) emitters. The origin for the transfer layer containing the green emitter was shifted +165 micrometers relative to the origin for the transfer layer containing the red emitter.

Deposition of Non-Patterned Emitter Layer and Deposition of Cathode

A non-patterned emitter layer containing perylene blue dye and a two-layer cathode were then deposited on the patterned emitter layer comprising the first (red) and second (green) emitters following the procedure described in conjunction with Example 1 for the deposition of these layers.

Electroluminescence Spectra

The electroluminescence spectrum for Example 10 was observed using the procedure described in conjunction with Example 2 and showed a pattern of alternating red, green and blue stripes, the red and green emission patterns corresponding to the areas patterned by the selective thermal transfer via LITI.

Example 11

Example 11 illustrates a method of making an electroluminescent device according to the invention in which a transfer layer comprising a first emitter is selectively thermally transferred to a receptor to form a patterned emitter layer on a solvent-susceptible layer, and a layer comprising a second emitter is disposed on the patterned emitter layer to provide a non-patterned emitter layer.

Preparation of Electroluminescent Device

A donor was prepared according to the procedure described in conjunction with Example 1 and the transfer layer was selectively thermally transferred to a receptor containing a solvent-susceptible layer that was prepared according to the procedure described in conjunction with Example 9 to yield a patterned emitter layer. Two lasers were used at a power of 16 watts in a unidirectional scan with a triangle dither pattern and frequency of 400 KHz. The requested line width was 110 micrometers with a pitch of 165 micrometers, and the dose was 0.650 J/cm$^2$. A non-patterned emitter layer containing perylene blue dye and a two-layer cathode were then deposited on the patterned emitter layer following the procedure described in conjunction with Example 1 for the deposition of these layers.

Preparation of Control Device for Example 11

A control device was also prepared following the procedure used in conjunction with Example 11, except omitting preparation of the donor and thermal transfer of the patterned emitter layer. Consequently, the non-patterned emitter layer containing perylene blue dye was disposed directly on the solvent-susceptible layer and without an intervening patterned emitter layer.

Electroluminescence Spectra

The electroluminescence spectra for the device of Example 11 and its control device were observed using the procedure described in conjunction with Example 2. The device of Example 11 showed a pattern of alternating yellow and blue stripes, the yellow emission pattern corresponding to the area patterned by the selective thermal transfer via LITI. The control device showed a pattern of blue stripes corresponding to the pattern of ITO stripes.

The complete disclosure of all patents, patent applications, and publications, and electronically available material cited herein are incorporated by reference. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of making an electroluminescent device comprising:
    selectively thermally transferring a portion of a transfer layer comprising a first emitter to a receptor to form a patterned emitter layer comprising the first emitter disposed on the receptor; and
    disposing a layer comprising a second emitter on the patterned emitter layer and the receptor to form a non-patterned emitter layer comprising the second emitter.

2. The method of claim 1 further comprising selectively thermally transferring, prior to forming the non-patterned emitter layer, a portion of a second transfer layer comprising a third emitter to the receptor to form a second patterned emitter layer comprising the third emitter, disposed on the receptor.

3. The method of claim 1 wherein the receptor is an anode, a hole transport layer, a hole injection layer, an electron blocking layer, a dielectric layer, a passivation layer, a substrate, or a combination thereof.

4. The method of claim 1 wherein the non-patterned emitter layer is an undoped electron transport layer, a doped electron transport layer, an undoped hole blocking layer, a doped hole blocking layer, or a combination thereof.

5. The method of claim 1 wherein the receptor is a hole transport layer and is attached to an anode.

6. The method of claim 5 wherein the device further comprises a hole injection layer disposed between the hole transport layer and the anode.

7. The method of claim 1 further comprising disposing a cathode on the non-patterned emitter layer.

8. The method of claim 1 wherein the receptor is solvent-susceptible.

9. A method of making an electroluminescent device comprising:
    providing a non-patterned layer comprising a first emitter; and
    selectively thermally transferring a portion of a transfer layer comprising a second emitter to the non-patterned emitter layer to form a patterned emitter layer comprising the second emitter, disposed on the non-patterned emitter layer.

10. The method of claim 9 further comprising selectively thermally transferring a portion of a second transfer layer comprising a third emitter to the non-patterned emitter layer to form a second patterned emitter layer comprising the third emitter, disposed on the non-patterned emitter layer.

11. The method of claim 9 wherein the non-patterned emitter layer is an undoped electron transport layer, a doped electron transport layer, an undoped hole blocking layer, a doped hole blocking layer, an undoped electron injecting layer, a doped electron injecting layer, or a combination thereof.

12. The method of claim 9 further comprising disposing an anode on the patterned emitter layer and the non-patterned emitter layer.

13. The method of claim 12 wherein the device further comprises a hole transport layer, a hole injection layer, an electron blocking layer, or a combination thereof, disposed between the patterned emitter layer and the anode.

14. The method of claim 9 wherein the side of the non-patterned emitter layer opposite the patterned emitter layer is attached to a cathode.

15. The method of claim 9 wherein the non-patterned emitter layer is solvent-susceptible.

16. A method of making an electroluminescent device comprising:
    providing a solvent-susceptible layer;
    disposing a patterned layer comprising a first emitter and a non-volatile component that is the same as or different than the first emitter on the solvent-susceptible layer; and disposing a layer comprising a second emitter on the patterned layer and the solvent-susceptible layer to form a non-patterned emitter layer comprising the second emitter.

17. The method of claim 16 wherein disposing the patterned layer comprises selectively thermally transferring a portion of a transfer layer comprising the first emitter and the non-volatile component.

18. The method of claim 16 further comprising, prior to forming the non-patterned emitter layer, disposing a second patterned layer comprising a third emitter on the solvent-susceptible layer.

19. The method of claim 18 wherein disposing the second patterned layer comprises selectively thermally transferring a portion of a second transfer layer comprising the third emitter.

20. The method of claim 19 wherein the second transfer layer further comprises a non-volatile component.

21. A method of making an electroluminescent device comprising:
providing a solvent-susceptible, non-patterned layer comprising a first emitter; and
disposing a patterned layer comprising a second emitter and a non-volatile component that is the same as or different than the second emitter, on the solvent-susceptible layer.

22. The method of claim 21 wherein disposing the patterned layer comprises selectively thermally transferring a portion of a transfer layer comprising the second emitter and the non-volatile component.

23. The method of claim 21 further comprising disposing a second patterned layer comprising a third emitter on the solvent-susceptible layer.

24. The method of claim 23 wherein disposing the second patterned layer comprises selectively thermally transferring a portion of a second transfer layer comprising the third emitter.

25. The method of claim 24 wherein the second transfer layer further comprises a non-volatile component.

* * * * *